US008969200B2

(12) United States Patent (10) Patent No.: US 8,969,200 B2
Hebding et al. (45) Date of Patent: Mar. 3, 2015

(54) APPARATUS AND METHOD FOR INTEGRATION OF THROUGH SUBSTRATE VIAS

(75) Inventors: Jeremiah Hebding, Poughkeepsie, NY (US); Megha Rao, Clifton Park, NY (US); Colin McDonough, Albany, NY (US); Matthew Smalley, Ballston Lake, NY (US); Douglas Duane Coolbaugh, Highland, NY (US); Joseph Piccirillo, Jr., Clifton Park, NY (US); Stephen G. Bennett, Niskayuna, NY (US); Michael Liehr, Guilderland, NY (US); Daniel Pascual, Wolcott, VT (US)

(73) Assignee: The Research Foundation of State University of New York, Albany, NY (US)

( * ) Notice: Subject to any disclaimer, the term of this patent is extended or adjusted under 35 U.S.C. 154(b) by 179 days.

(21) Appl. No.: 13/445,636

(22) Filed: Apr. 12, 2012

(65) Prior Publication Data

US 2013/0270711 A1 Oct. 17, 2013

(51) Int. Cl.
*H01L 21/44* (2006.01)
(52) U.S. Cl.
USPC ...... 438/667; 257/698; 257/774; 257/E21.614
(58) Field of Classification Search
USPC .................................. 257/E21.614; 438/667
See application file for complete search history.

(56) References Cited

U.S. PATENT DOCUMENTS

| 2005/0161837 | A1* | 7/2005 | Matsui | 257/797 |
| 2005/0282395 | A1* | 12/2005 | Chang et al. | 438/740 |
| 2007/0166997 | A1* | 7/2007 | Knorr | 438/622 |
| 2010/0155932 | A1* | 6/2010 | Gambino et al. | 257/698 |
| 2010/0297844 | A1* | 11/2010 | Yelehanka et al. | 438/667 |
| 2012/0322260 | A1* | 12/2012 | Tsai et al. | 438/667 |
| 2013/0026643 | A1* | 1/2013 | England et al. | 257/774 |

OTHER PUBLICATIONS

SEMICON Europa 2011 Conference, 3D SoC and Heterogeneous Integrations, http://semieurope.omnibooksonline.com/2011/semicon_europa/SEMI_TechARENA_presentations/3DICsession_04_Jean_Michailos_STMicroelectronics.pdf, Oct. 11-13, 2011.

* cited by examiner

*Primary Examiner* — Wensing Kuo
*Assistant Examiner* — Shaka White
(74) *Attorney, Agent, or Firm* — Heslin Rothenberg Farley & Mesiti P.C.

(57) ABSTRACT

An apparatus and method are provided for integrating TSVs into devices prior to device contacts processing. The apparatus includes a semiconducting layer; one or more CMOS devices mounted on a top surface of the semiconducting layer; one or more TSVs integrated into the semiconducting layer of the device wafer; at least one metal layer applied over the TSVs; and one or more bond pads mounted onto a top layer of the at least one metal layer, wherein the at least one metal layer is arranged to enable placement of the one or more bond pads at a specified location for bonding to a second device wafer. The method includes obtaining a wafer of semiconducting material, performing front end of line processing on the wafer; providing one or more TSVs in the wafer; performing middle of line processing on the wafer; and performing back end of line processing on the wafer.

17 Claims, 16 Drawing Sheets

APPARATUS AND METHOD FOR INTEGRATION OF THROUGH SUBSTRATE VIAS

BACKGROUND

The present disclosure relates generally to fabrication of integrated circuits, semiconductor devices and other miniaturized devices, and more particularly, to the integration of through substrate vias ("TSVs") in a complementary metal-oxide semiconductor ("CMOS") device.

Currently, the configuration of semiconductor chips only allows for chips to be bonded side to side or using wire bonding. The available bonding methods for the semiconductor chips have been limited due to the placement of the various elements on the semiconductor chips. Generally, when chips are manufactured, the TSVs are created after the contacts and transistors have been applied to the chips. By inserting the TSVs after the contacts and transistors, the chip loses surface space and unreliable regions are created within the 3D stacks of chips. In addition, when the TSVs are inserted last, the contacts must be made of tungsten in order to reduce the likelihood of the contacts being damaged during the annealing process of the TSVs. When tungsten contacts are used, the speed of the semiconductor chips generally slows down due to the resistivity of the tungsten contacts increasing. The current configurations also limit where you can wire because if the TSVs are created last, wiring will have to be done around the TSVs.

The present disclosure contemplates a new and improved apparatus and method for integrating TSVs in CMOS devices that overcome the current limitations.

SUMMARY

In one aspect, provided herein is a novel method of integrating through substrate vias. The method includes: obtaining a wafer of semiconducting material; performing front end of line processing on the wafer; providing one or more through substrate vias in the wafer; performing middle of line processing on the wafer; and performing back end of line processing on the wafer.

In another aspect provided herein, the novel method of integrating through substrate vias includes: obtaining a wafer of semiconducting material; etching one or more trenches into the wafer; depositing one or more dielectric materials into the one or more trenches; polishing the wafer to remove any excess dielectric material from the one or more trenches; building at least one complementary metal-oxide semiconductor device onto the wafer; applying a contamination barrier over the wafer, the one or more trenches, and the at least one complementary metal-oxide semiconductor device; applying a resist material over the contamination barrier; etching from a wafer surface into the wafer to create one or more wafer holes; depositing a dielectric liner onto the wafer surface and into the one or more wafer holes; polishing the wafer to remove the dielectric liner on the wafer to a desired dielectric height suitable for contact with one or more complementary metal-oxide semiconductor devices; cleaning the wafer and wafer holes to remove any contaminants from the surface of the wafer and wafer holes; depositing a metal seed layer for metalizing the through substrate vias; plating the one or more wafer holes with a conductor; polishing the wafer to remove any of the conductor from the surface of the wafer; annealing the wafer to promote any of the conductor from the through substrate vias to expand out of the one or more wafer holes prior to operation of a device containing the wafer; polishing the wafer to remove any of the conductor from the surface of the wafer which was created from the annealing process; applying an etch stop to the surface of the wafer; patterning where to etch one or more device contacts in the dielectric liner; etching the one or more device contacts to contact one or more complementary metal-oxide semiconductor devices mounted on the wafer; metalizing the one or more device contacts; polishing the wafer to remove any metal from the surface of the wafer; applying at least one metal layer to contact the through substrate vias and one or more device contacts for one or more complementary metal-oxide semiconductor devices; applying a fully metalized back end of line ending with a bonding pad layer for bonding of the wafer; and bonding the wafer to a base technology wafer.

In yet another aspect, provided herein is a novel device wafer including: a semiconducting layer; one or more complementary metal-oxide semiconductor devices mounted on a top surface of the semiconducting layer; one or more through substrate vias integrated into the semiconducting layer of the device wafer; at least one metal layer applied over the through substrate vias; and one or more bond pads mounted onto a top layer of the at least one metal layer, wherein the at least one metal layer is arranged to enable placement of the one or more bond pads at a specified location for bonding to a second device wafer.

These, and other embodiments, objects, features and advantages of this invention will become apparent from the following detailed description of the various aspects of the invention taken in conjunction with the accompanying drawings and are considered a part of the claimed invention.

BRIEF DESCRIPTION OF DRAWINGS

The accompanying drawings, which are incorporated in and constitute a part of the specification, illustrate embodiments of the invention and together with the detailed description herein, serve to explain the principles of the invention. It is emphasized that, in accordance with the standard practice in the industry, various features are not drawn to scale. In fact, the dimensions of the various features may be arbitrarily increased or reduced for clarity of discussion. The drawings are only for purposes of illustrating preferred embodiments and are not to be construed as limiting the invention.

DETAILED DESCRIPTION

Figure 1:
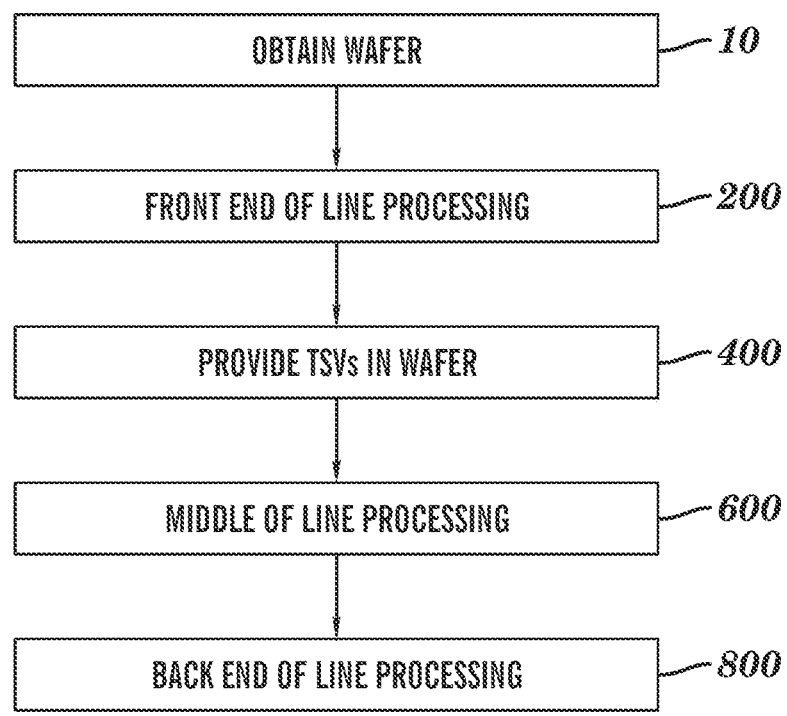
FIG. 1 depicts one embodiment of a process for integrating through substrate vias in a wafer of semiconducting material, in accordance with one or more aspects of the present invention.

Referring to the drawings, wherein like reference numerals are used to indicate like or analogous components or steps throughout the several views, and with particular reference to FIG. 1, there is illustrated an exemplary method of integrating through substrate vias ("TSVs") into standard complementary metal-oxide semiconductor ("CMOS") device process flows using pre-contact processing. It is also contemplated that the exemplary method may be used in bi-CMOS, bi-polar integration flows, and any type of transistor. The exemplary method of integrating TSVs is new in the approach to the wafer formation wherein the TSVs are formed prior to the contacts to the devices. As best seen in FIG. 1, the exemplary method includes the steps of obtaining a wafer 10, front end of line processing 200, providing the TSVs in the wafer 400, middle of line processing 600, and back end of line processing 800. These individual steps are described in greater detail hereinafter.

Figure 2:
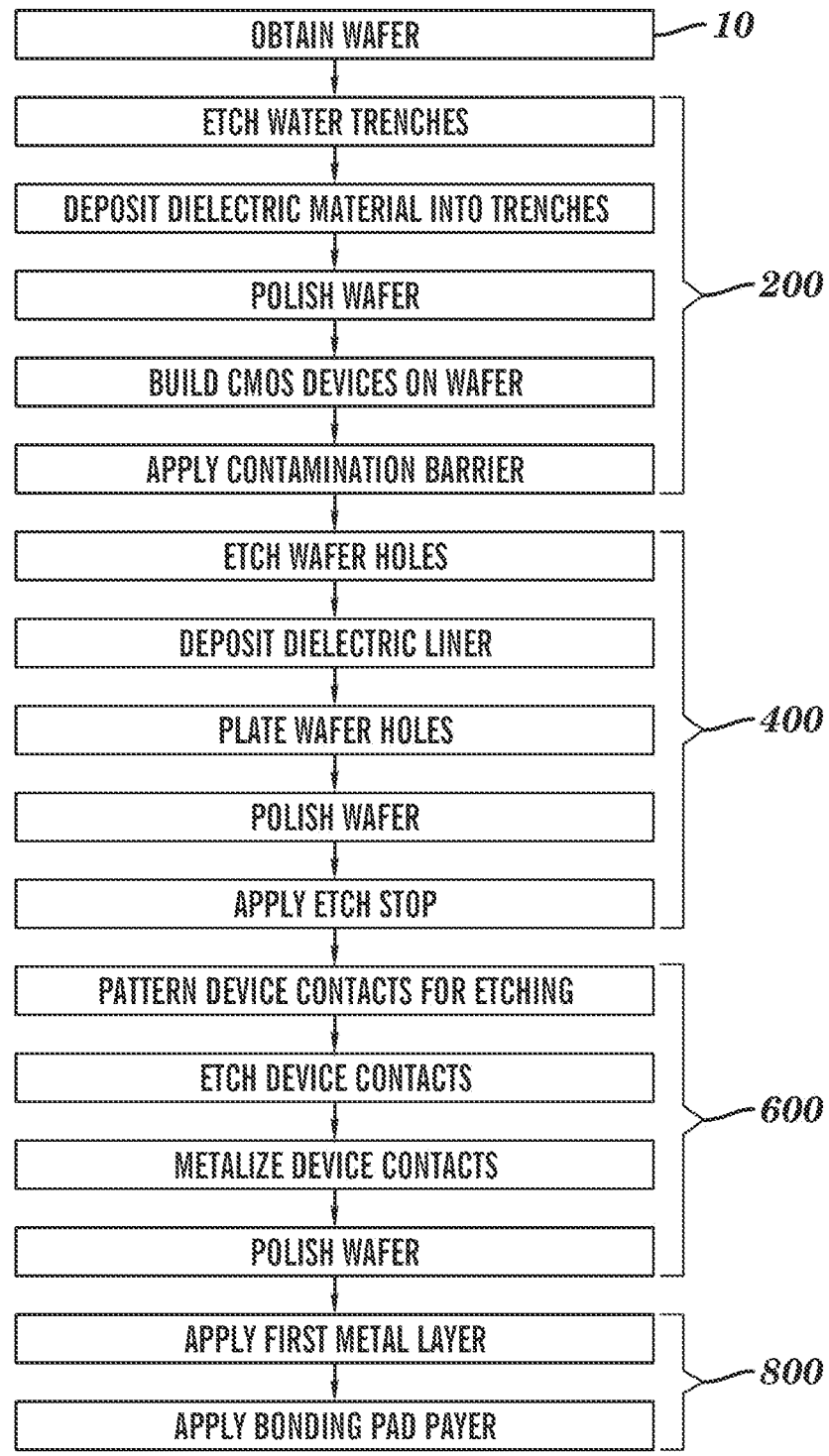
FIG. 2 depicts a second embodiment of the process for integrating through substrate vias in a wafer of semiconducting material, in accordance with one or more aspects of the present invention.
Figure 3:
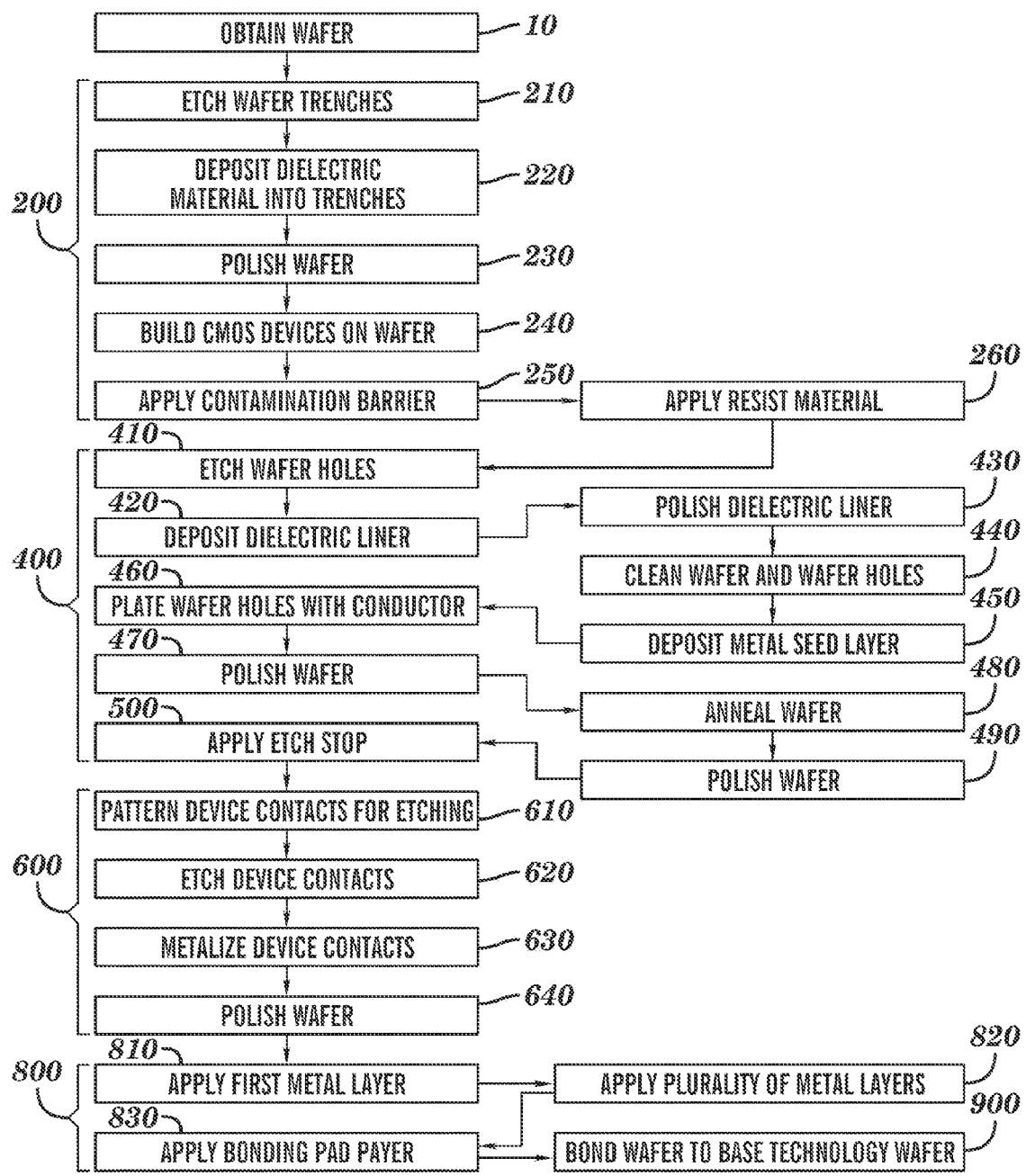
FIG. 3 depicts the second embodiment of FIG. 2 with additional optional steps in the process for integrating through substrate vias in a wafer of semiconducting material, in accordance with one or more aspects of the present invention.

As depicted in FIGS. 2 and 3, there is a second exemplary embodiment of a method of integrating through substrate vias which includes the steps of obtaining a wafer of semiconducting material 10; front end of line processing 200, including: etching one or more trenches into the wafer 210, depositing one or more dielectric materials into the one or more trenches 220, polishing the wafer to remove any excess dielectric material from the one or more trenches 230, building at least one complementary metal-oxide semiconductor device onto the wafer 240, applying a contamination barrier over the wafer, the one or more trenches, and the at least one complementary metal-oxide semiconductor device 250, and applying a resist material over the contamination barrier 260; providing the TSV's in the wafer 400, including: etching from a wafer surface into the wafer to create one or more wafer holes 410, depositing a dielectric liner onto the wafer surface and into the one or more wafer holes 420, polishing the wafer to remove the dielectric liner on the wafer to a desired dielectric height suitable for contact with one or more complementary metal-oxide semiconductor devices 430, cleaning the wafer and wafer holes to remove any contaminants from the surface of the wafer and wafer holes 440, depositing a metal seed layer for metalizing the through substrate vias 450, plating the one or more wafer holes with a conductor 460, polishing the wafer to remove any of the conductor from the surface of the wafer 470, annealing the wafer to promote any of the conductor from the through substrate vias to expand out of the one or more wafer holes prior to operation of a device containing the wafer 480, polishing the wafer to remove any of the conductor from the surface of the wafer which was created from the annealing process 490, and applying an etch stop to the surface of the wafer 500; middle of line processing 600, including: patterning where to etch one or more device contacts in the dielectric liner 610, etching the one or more device contacts to contact one or more complementary metal-oxide semiconductor devices mounted on the wafer 620, metalizing the one or more device contacts 630, and polishing the wafer to remove any metal from the surface of the wafer 640; back end of line processing 800, including: applying at least one metal layer to contact the through substrate vias and one or more device contacts for one or more complementary metal-oxide semiconductor devices 810, applying a plurality of metal layers to the first of the at least one metal layer to create a desired metallization scheme 820, and applying a fully metalized back end of line ending with a bonding pad layer for bonding of the wafer 830; and bonding the wafer to a base technology wafer 900. These individual steps are described in greater detail hereinafter.

As used herein, the term "wafer" is used to refer to a thin slice of semiconductor material used in the fabrication of integrated circuits, semiconductor devices, and other miniaturized devices and the term "base technology wafer" is used to refer to integrated circuits, semiconductor devices, and other miniaturized devices, including but not limited to CMOS, optoelectronics, infrared detectors, MEMS, and the like.

Figure 4:
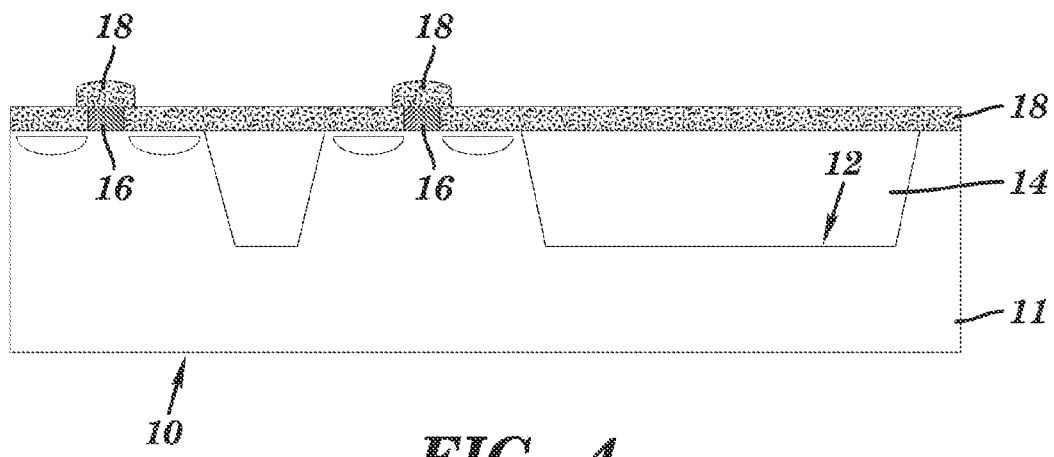
FIG. 4 depicts a cross-sectional view of the wafer after completion of the steps of etching trenches into the wafer, depositing a dielectric material into the trenches, polishing the wafer to remove excess dielectric material, mounting at least one CMOS device onto the wafer, and applying a contamination barrier over the wafer, trenches, and at least one CMOS device of the processes of FIGS. 2 and 3, in accordance with one or more aspects of the present invention.
Figure 5:
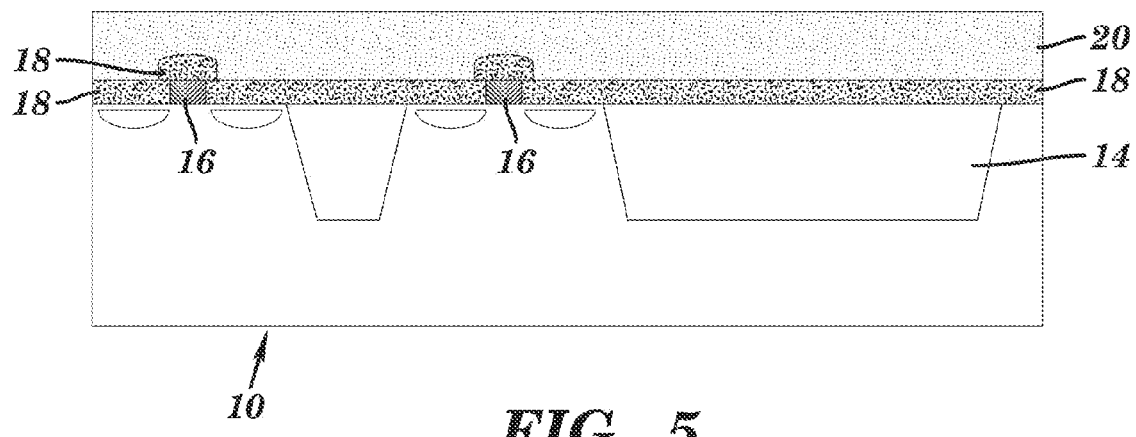
FIG. 5 depicts a cross-sectional view of the wafer of FIG. 4 having a resist material applied over the contamination barrier on the wafer, in accordance with one or more aspects of the present invention.

Referring now to FIG. 4, which depicts the wafer 10 after completion of the front end of line processing steps 200. The front end of line processing steps 200 include etching trenches into the wafer 210, depositing a dielectric material into the trenches 220, polishing the wafer to remove excess dielectric material 230, building at least one CMOS device onto the wafer 240, and applying a contamination barrier over the wafer, trenches, and at least one CMOS device 250. More particularly, in the depicted embodiment, the wafer 10 is obtained and is composed of a semiconducting material 11, such as silicon. Shallow trench isolation is then performed by etching a pattern of trenches 12 into the semiconducting material 11. The trenches 12 may then be filled with one or more dielectric materials 14. The dielectric material 14 may be silicon dioxide, silicon nitride, or the like. The wafer 10 may then be polished to remove any excess dielectric material 14 from the surface. Chemical mechanical planarization ("CMP") may be used to polish the wafer 10 for removing any excess dielectric material 14. Next, at least one CMOS device 16 is built onto the semiconducting material 11 of the wafer 10, in known fashion, and a contamination barrier 18 may be applied over the wafer 10 and the at least one CMOS device 16. The contamination barrier 18 is applied to prevent contaminants from getting into the CMOS devices 16 and may be a barrier nitride or other suitable barrier material. The CMOS device 16 may be a transistor, capacitor, resistor, or the like. Next as seen in FIG. 5, a resist material 20 is applied over the contamination barrier 18 on the wafer 10.

Referring now to FIGS. 6-12, the steps 400 of providing TSVs in the wafer 10 are illustrated. The process of providing TSVs in the wafer, step 400 includes etching from a wafer surface into the wafer to create one or more wafer holes 410; depositing a dielectric liner onto the wafer surface and into the one or more wafer holes 420; polishing the wafer to remove the dielectric liner on the wafer to a desired dielectric height suitable for contact with one or more complementary metal-oxide semiconductor devices 430; cleaning the wafer and wafer holes to remove any contaminants from the surface of the wafer and wafer holes 440; depositing a metal seed layer for metalizing the through substrate vias 450; plating the one or more wafer holes with a conductor 460; polishing the wafer to remove any of the conductor from the surface of the wafer 470; annealing the wafer to promote any of the conductor from the through substrate vias to expand out of the one or more wafer holes prior to operation of a device containing the wafer 480; polishing the wafer to remove any of the conductor from the surface of the wafer which was created from the annealing process 490; applying an etch stop to the surface of the wafer 500.

Figure 6:
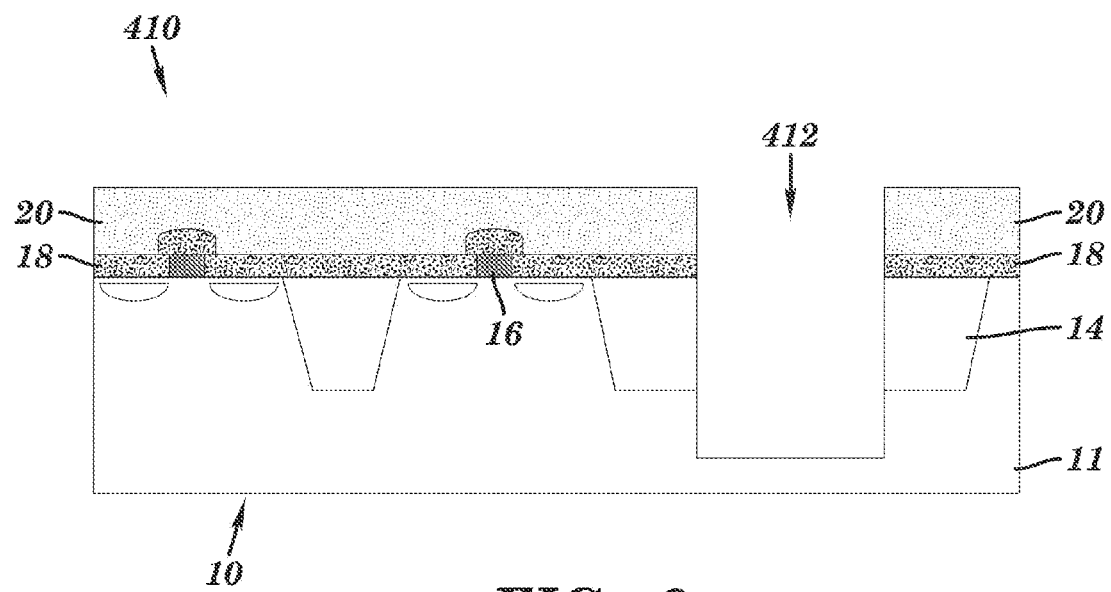
FIG. 6 depicts a cross-sectional view of the wafer after the etching step to create one or more wafer holes, in accordance with one or more aspects of the present invention.
Figure 7:
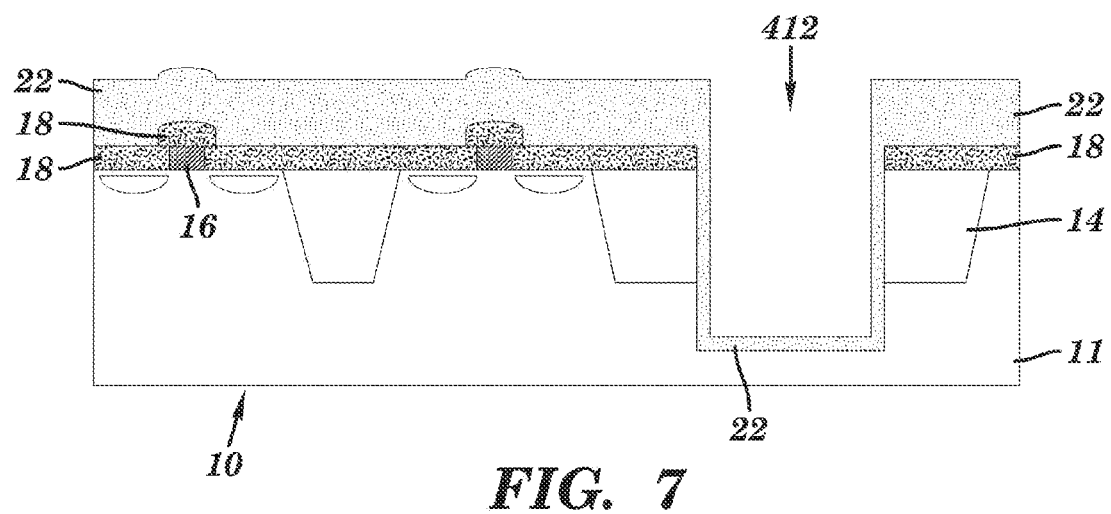
FIG. 7 depicts a cross-sectional view of the wafer after a dielectric liner has been deposited on the wafer and in the wafer holes, in accordance with one or more aspects of the present invention.
Figure 8:
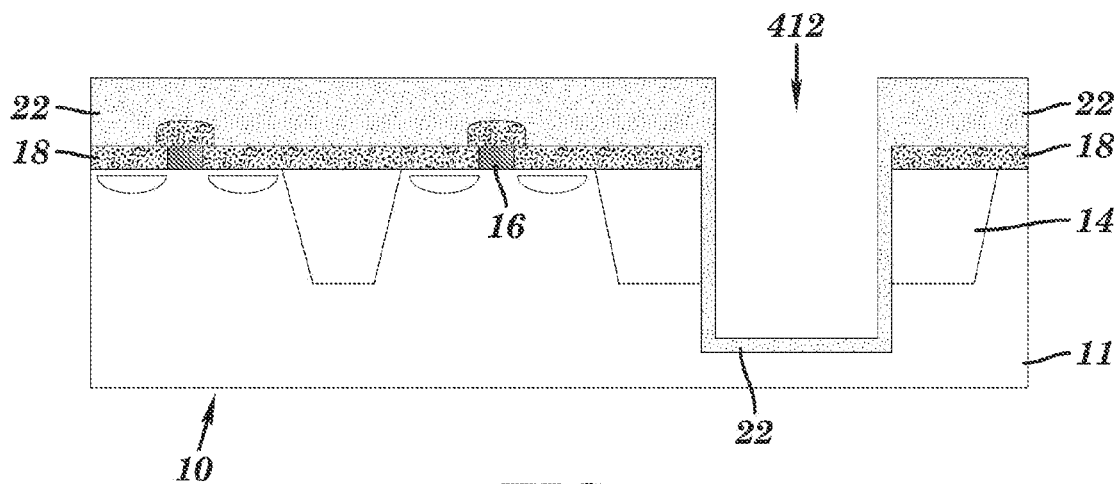
FIG. 8 depicts a cross-sectional view of the wafer after the polishing step to remove dielectric liner to obtain a wafer thickness suitable to enable contact with the CMOS devices and the cleaning step are completed, in accordance with one or more aspects of the present invention.

As best seen in FIG. 6, the resist material 20, the contamination barrier 18, the dielectric material 14, and a portion of the semiconducting material 11 of the wafer 10 are etched in step 410 to create one or more wafer holes 412. The wafer holes 412 may be patterned with a thick resist soft mask using a nitride and oxide reactive-ion etching and deep silicon reactive-ion etching, or another technique known in the art. The wafer holes 412 in the depicted embodiment are 50 microns deep, however other size wafer holes are contemplated, including around between 2 microns to 40 microns. The location of the wafer holes 412 is determined based on the circuit design for the end use of the wafer 10. Referring now to FIG. 7, the step 420 is illustrated wherein a dielectric liner 22 is deposited onto the surface of the wafer 10 and into the one or more wafer holes 412. The dielectric liner 22 may be an oxide, silicon nitride, polyimide, or other low k dielectrics. As best seen in FIG. 8, the dielectric liner 22 is then polished in step 430 to obtain a desired dielectric height which is suitable for contacting the one or more CMOS devices 16. The polishing step 430 may include planarizing the dielectric liner 22 to obtain the desired thickness. The desired thickness may range from approximately 150 nm to 300 nm, however other thickness have been contemplated. Next the wafer 10 and wafer holes 412 are cleaned in step 440 to remove any residue from the polishing step 430 and any other contaminants that may be present on the wafer 10 or in the wafer holes 412.

Figure 9:
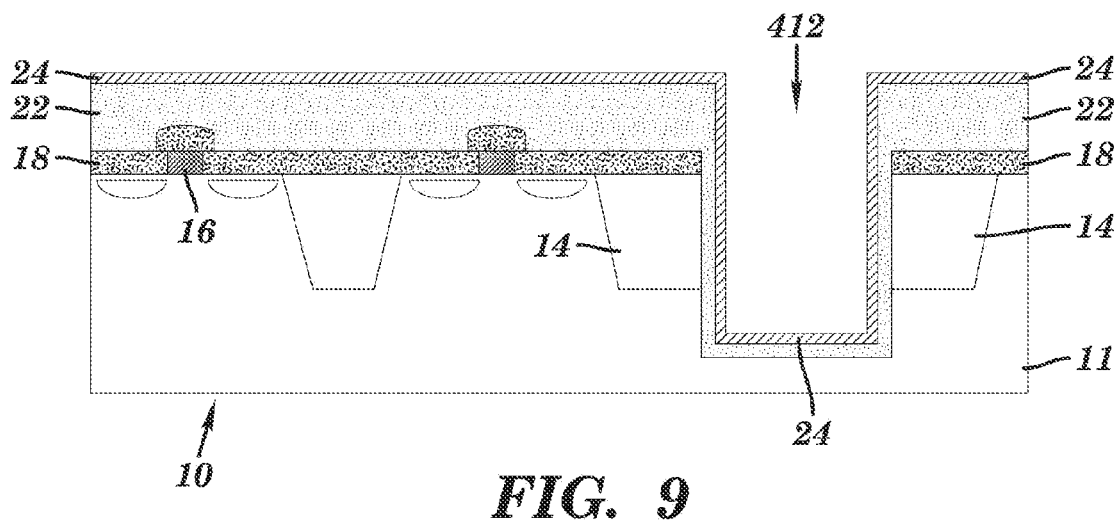
FIG. 9 depicts a cross-sectional view of the wafer after the metal seed layer is deposited onto the wafer surface and in the wafer holes, in accordance with one or more aspects of the present invention.
Figure 10:
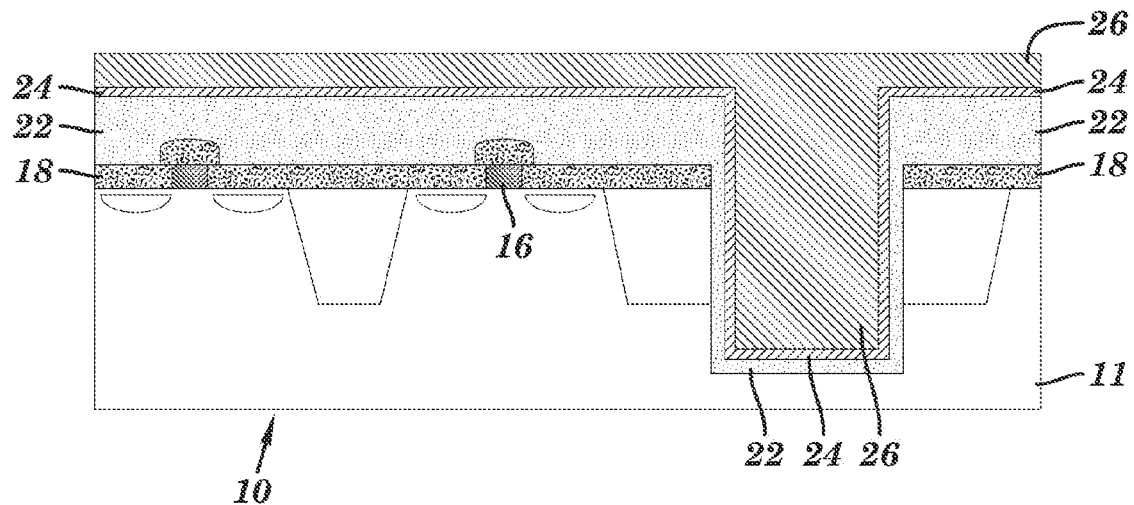
FIG. 10 depicts a cross-sectional view of the wafer after the wafer holes are plated with a conductor, in accordance with one or more aspects of the present invention.
Figure 11:
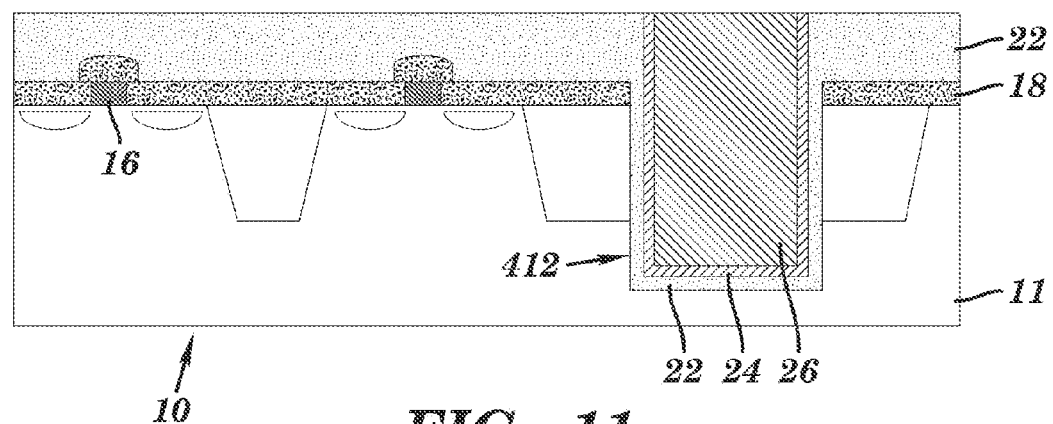
FIG. 11 depicts a cross-sectional view of the wafer after the steps of polishing the wafer surface to remove any contaminants, annealing the wafer, and polishing the wafer to remove any contaminants created during the annealing process, in accordance with one or more aspects of the present invention.
Figure 12:
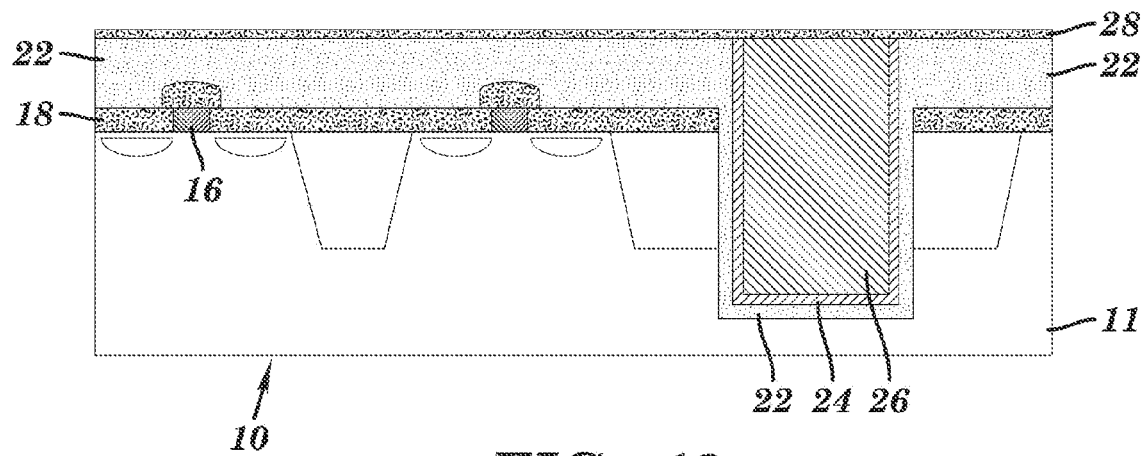
FIG. 12 depicts a cross-sectional view of the wafer after the step of applying an etch stop to the wafer surface is performed, in accordance with one or more aspects of the present invention.

The step 450 of depositing a metal barrier and seed layer 24 onto the wafer 10 is depicted in FIG. 9. The metal barrier and seed layer 24 may be tantalum, tantalum nitride, or other suitable barrier material, and ruthenium, copper, or other suitable seed material. As best seen in FIG. 10, the wafer holes 412 have been plated with a conductor 26. The plating is performed in a high aspect, bottom up fill manner or another manner known in the art. The conductor 26 may be copper, a copper alloy, another electroplateable metal, or the like. Referring now to FIG. 11, the wafer 10 is depicted after the wafer polishing step 470, the annealing step 480, and the polishing step 490 are performed. The polishing step 470 may be performed by CMP to remove any conductor 26 overburden from the surface of the wafer 10. Next, the wafer 10 is annealed to promote any of the conductor 26 from the TSVs to expand out of the one or more wafer holes 412. The annealing step 480 is performed to decrease the likelihood of conductor 26 expansion in the TSV which would disturb the back end of line layers which may be applied above the TSVs. As conductors, such as copper, are heated they may get larger, therefore the annealing step 480 applies high temperatures to the conductor 26 prior to the formation of the device contacts to encourage the expansion of the conductor 26 without affecting the device contact and decreasing the likelihood that the TSV will pop out of the wafer hole 412 when the device is used. Finally, a second polishing step 490 is performed to remove any contaminants created during the annealing process. FIG. 12 illustrates the wafer 10 after the etch stop 28 has been applied to the wafer 10 during step 500. The etch stop 28 caps the wafer and may be made of nitride, a nitrogen-doped silicon carbide, or other suitable low-k etch stops.

Figure 13:
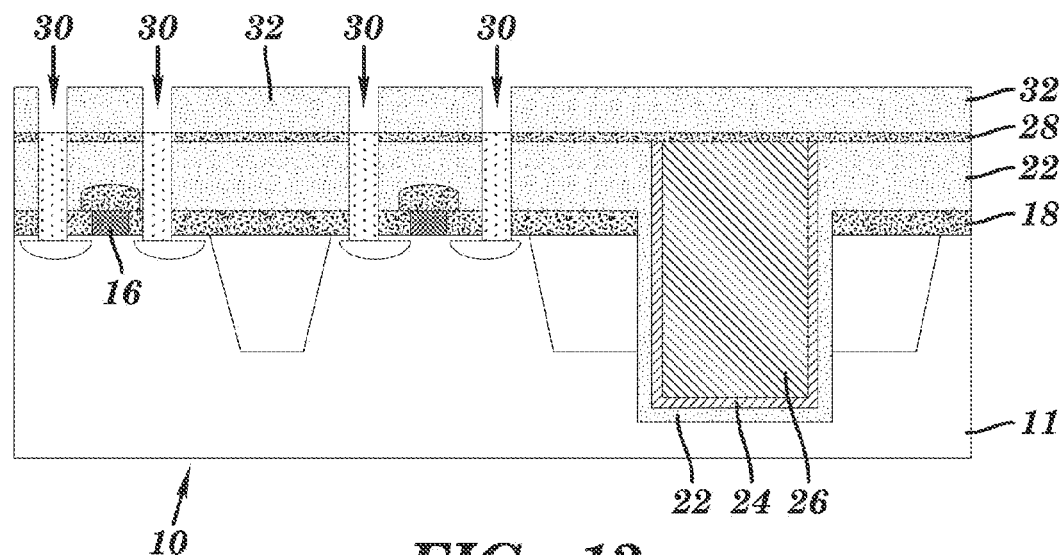
FIG. 13 depicts a cross-sectional view of the wafer during the steps of patterning where to etch one or more device contacts and etching the device contacts, in accordance with one or more aspects of the present invention.
Figure 14:
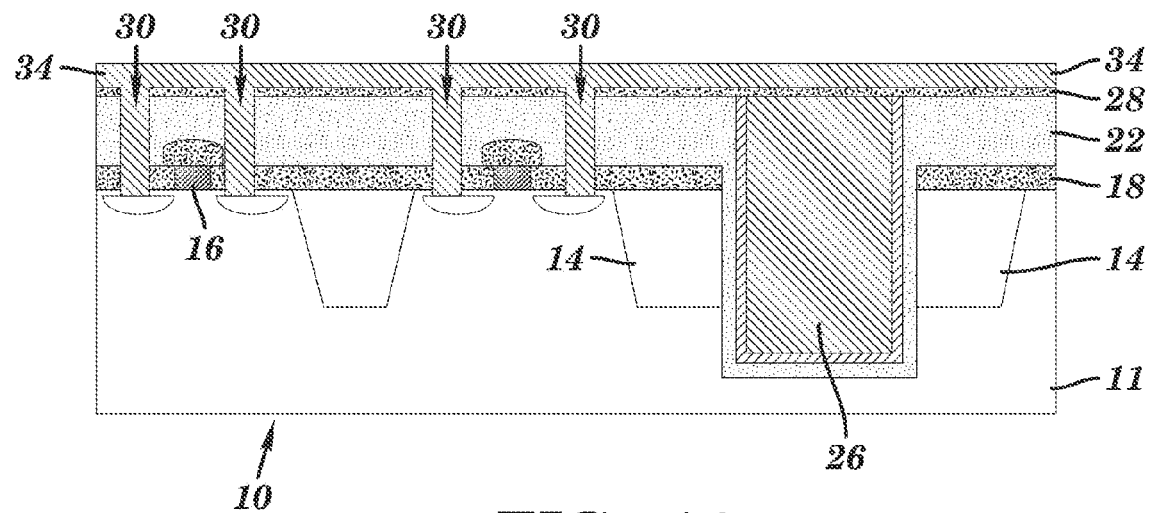
FIG. 14 depicts a cross-sectional view of the wafer after the device contacts have been metalized, in accordance with one or more aspects of the present invention.
Figure 15:
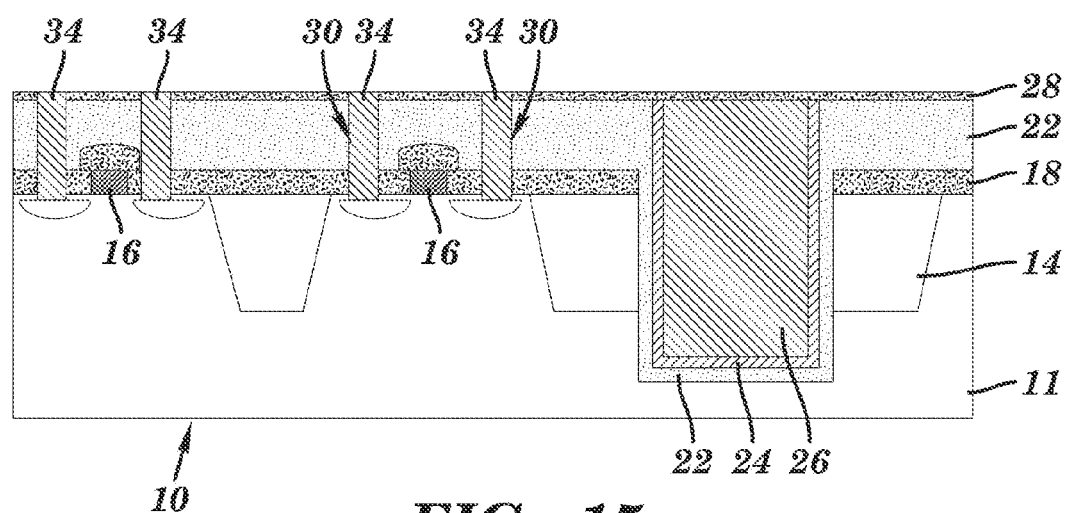
FIG. 15 depicts a cross-sectional view of the wafer after a polishing step has been completed to remove any contaminants from the surface of the wafer, in accordance with one or more aspects of the present invention.

The middle of line processing steps 600 are illustrated in FIGS. 13-15. The middle of line processing step 600 include: patterning where to etch the one or more device contacts 610, etching the device contacts 620, metalizing the device contacts 630, and polishing the wafer 640. As best seen in FIG. 13, the wafer 10 has been patterned in step 610 and the device contacts etched in step 620. The patterning step 610 includes selecting a pattern 32 which has the device contacts 30 in the desired positions. Next, the device contacts 30 are etched in the locations determined by the pattern 32. The location of the device contacts 30 is selected based on the location of the CMOS devices and drives the yield of the device. Referring now to FIG. 14, the step 630 of metalizing the device contacts 30 with a conductor 34 is depicted. FIG. 15 illustrates the wafer 10 after the wafer polishing step 640. The wafer 10 is polished after the device contact metallization step 630 to remove any conductor 34 from the surface of the wafer.

Figure 16:
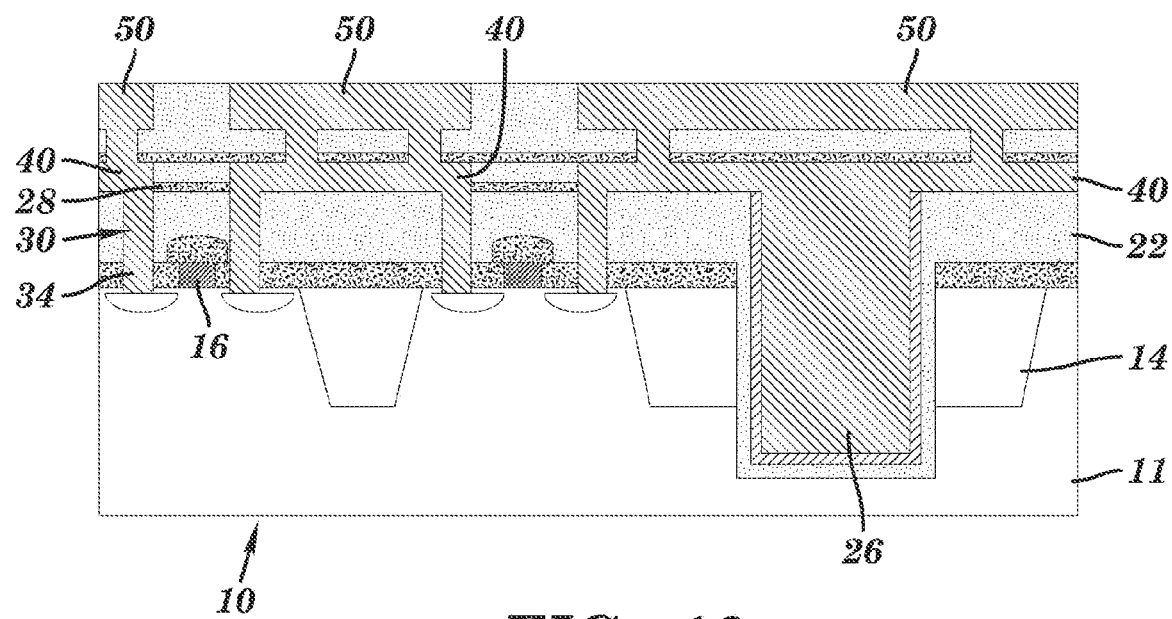
FIG. 16 depicts a cross-sectional view of the wafer having two metal layers contacting the TSVs and device contacts for the CMOS devices, in accordance with one or more aspects of the present invention.

Referring now to FIG. 16, the back end of line processing step 800 is depicted. The back end of line processing step 800 includes applying at least one metal layer to contact the through substrate vias and one or more device contacts for one or more complementary metal-oxide semiconductor devices 810; applying a plurality of metal layers to the first of the at least one metal layer to create a desired metallization scheme 820; applying a fully metalized back end of line ending with a bonding pad layer for bonding of the wafer 830. The wafer 10 having a first metal layer 40 contacting the conductor 26 of the TSVs and device contacts 30 for the CMOS devices 16 is depicted in FIG. 16. The first metal layer 40 is applied during step 810 and may be applied in a manner known in the art. A second metal layer 50 may then be applied to the first metal layer 40 during step 820 in a manner known in the art. Additional metal layers may be applied to the wafer 10 above the first and second metal layers 40, 50 in a manner known in the art. The flexible back end of line integration allows highly reliable use of low-k and ultra-low-k dielectrics, which reduce capacitance and make the devices more reliable. Once the desired wafer 10 configuration has been created a bonding pad layer may be applied to the top metal layer. The bonding pad layer may be used to bond the wafer 10 to a base technology wafer 950 using a known bonding technique, such as compression bonding, thermo-compression bonding, ultrasonic bonding, fusion bonding, and soldering can be utilized to bond the individual die to the base technology wafer. The wafer 10 and the base technology wafer 950 may be bonded by metal to metal bonds which may be copper to copper bonds, or employ other metals.

By using the TSV integration methods of FIGS. 1-3 there are a number of advantages over currently used integration methods including, but not limited to, the ability to reduce process complexity and allow for the use of copper contacts. In addition, this TSV integration method allows for back end of line wiring freedom by removing the current need to route wiring around TSVs and allowing for the use of low-k and ultra-low-k dielectrics. Furthermore, the bond pads that connect three dimensional chip stacks to TSVs do not need to be in direct contact with the TSV thereby allowing for greater flexibility in design. The TSV integration methods of FIGS. 1-3 also allow for standard CMOS scaling and high yield and reliable contacts to the CMOS contacts, preserving contact and back end of line integrity.

Figure 17:
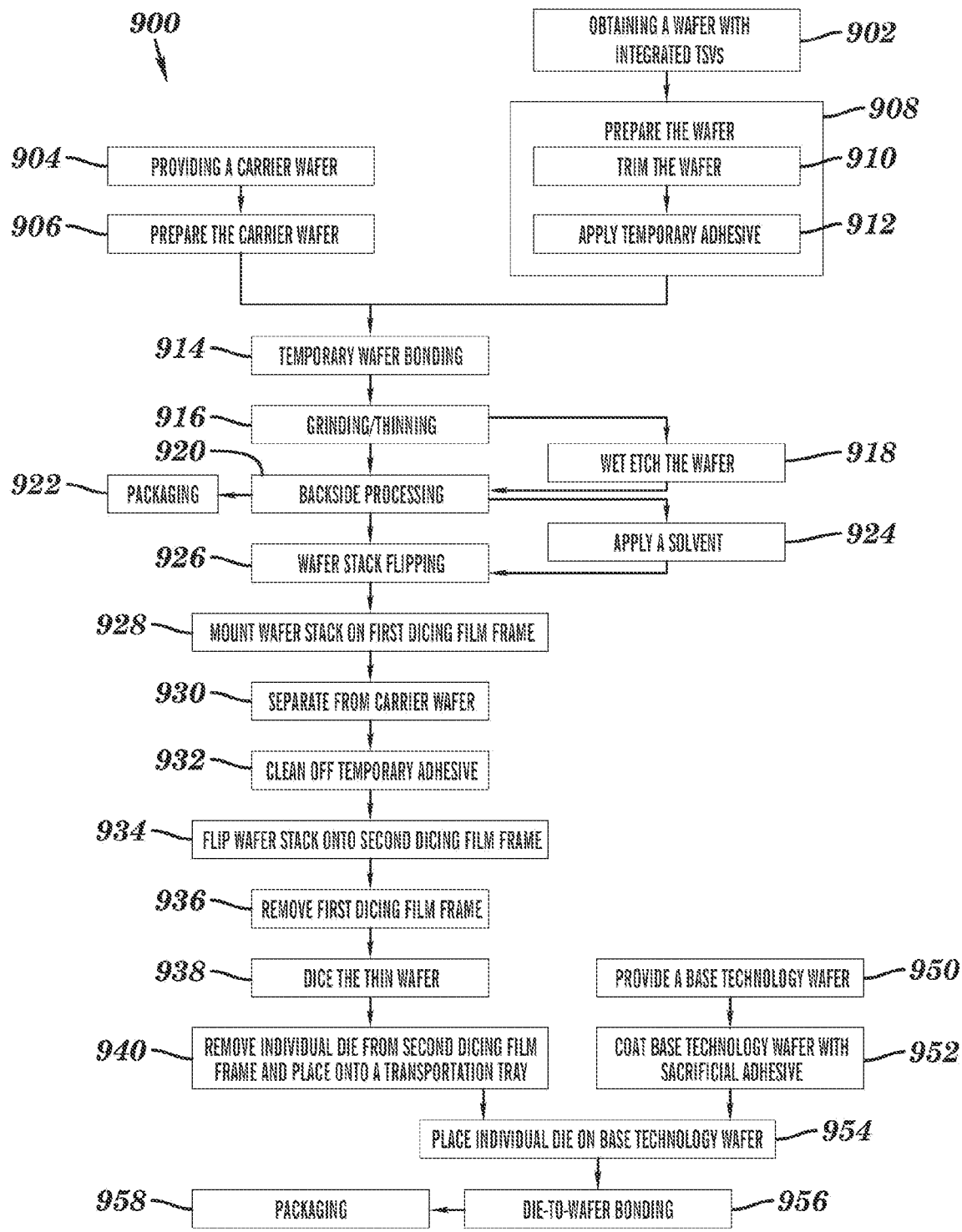
FIG. 17 depicts one embodiment of the wafer to base technology wafer bonding process of FIG. 3, in accordance with one or more aspects of the present invention.

Referring now to FIG. 17, there is illustrated an exemplary bonding process 900 for mounting the individual die 960 created from the wafer with integrated TSVs 920, which is a device wafer, to a base technology wafer 950. One method of bonding the individual die to a base technology wafer is described in U.S. patent application Ser. No. 13/445,550 filed Apr. 12, 2012, which application is herein incorporated by reference in its entirety. As used herein, the term "die" is used to refer to a small piece of semiconducting material which has been fabricated with a circuit and the term "carrier wafer" is used to refer to a base carrier that provides support to the device wafer while it is processed and thinned.

The device wafer 902, created by the method described above with reference to FIGS. 1-3, may be mounted to a base technology wafer 950 in accordance with one or more aspects of the present invention, by the bonding process 900. The bonding process 900 includes the steps of obtaining a device wafer 902 and a carrier wafer 904, preparing the carrier wafer 906, preparing the device wafer 908, which may include trimming the device wafer edge 910 and applying a temporary adhesive 912, temporarily bonding the wafers 914, grinding and thinning the device wafer 916, optionally wet etching the back side of the device wafer 918, processing the backside of the device wafer 920, applying a solvent to the temporary adhesive 924, flipping the device and carrier wafer stack 926, mounting the wafer stack to a first dicing film frame 928, separating the device wafer and carrier wafer 930, cleaning the temporary adhesive off the device wafer 932, optionally applying the wafer stack to a second dicing film frame 934, removing the first dicing film frame 936, dicing the thin device wafer 938, removing individual die from second dicing film frame and placing onto a transportation tray 940, providing a base technology wafer 950, coating the base technology wafer with a sacrificial adhesive 952, placing the individual die on the base technology wafer 954, and bonding the individual die to a base technology wafer 956. In addition, optional packaging steps 922 and 958 may be performed after the processing of the backside of the device wafer 920 and/or bonding of the individual die to a base technology wafer 956. Such packaging may include solder ball bumping, addition of bonding pads, wire bonding, and flip chip bonding. These individual steps are described in greater detail hereinafter.

Figure 18:
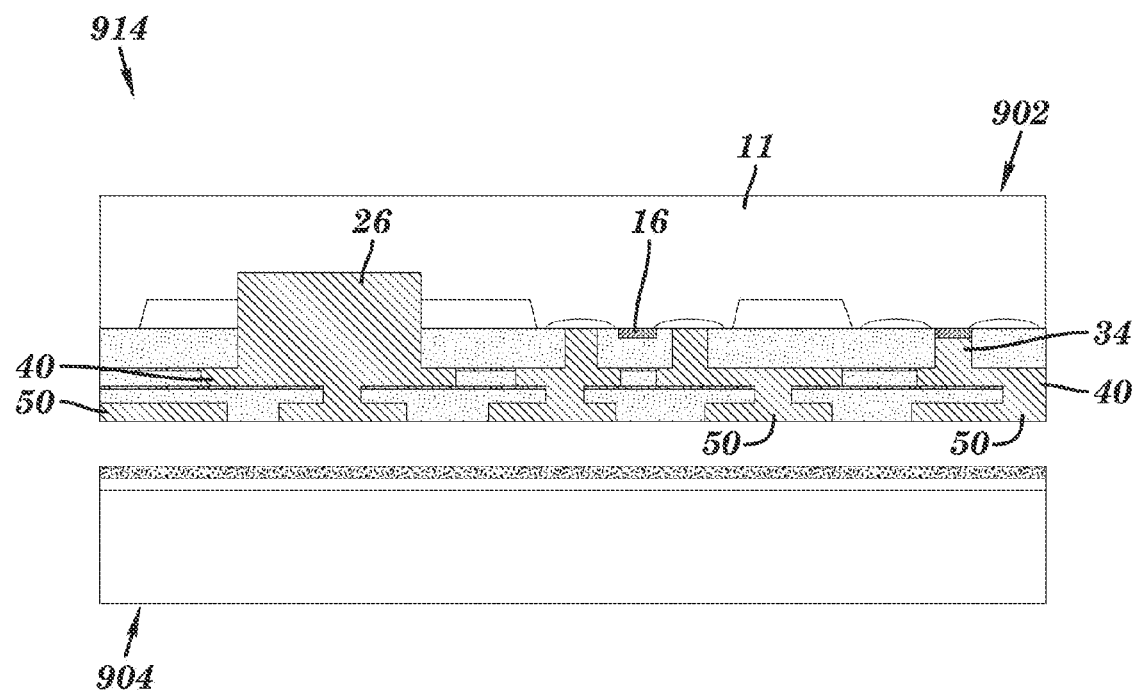
FIG. 18 depicts a cross-sectional view of the wafer of FIG. 16 being bonded to a carrier wafer during the process of bonding the wafer to a base technology wafer, in accordance with one or more aspects of the present invention.

More particularly, as best seen in FIGS. 17-24B and referring to the bonding process 900 of FIG. 3, the exemplary steps of bonding the device wafer 902, formed using the processes of FIGS. 1-3, to a base technology wafer 950 are shown. As best seen in FIG. 18, the step of temporarily bonding the device wafer 902 to the carrier wafer 904 is shown. Prior to temporarily bonding the wafers 902, 904, the device wafer 902 may be prepared in step 908 by trimming the front side edge of device wafer 902 in step 910 which may be done by partially grinding the edge of the device wafer 902, in a manner known in the art. Next, the trimmed device wafer 902 may have a temporary adhesive layer, not shown, placed over its' front to allow for temporary bonding with the carrier wafer 904 in step 914. The temporary adhesive may comprise thermoplastic, thermal cure, and UV cure adhesives, and may be applied by spin coating, or other known techniques.

The carrier wafer 904 may be prepared as described in step 906 and may include the carrier wafer 904 receiving a conformal coating, not shown, such as a silicon dioxide coating for a silicon wafer. Other coatings which serve to protect the carrier wafer from etching or any other damage, such as silicon nitride, aluminum oxide, or other passivating dielectrics, may be applied to the carrier wafer 904, which may comprise silicon, glass, quartz, or other materials. The coating may be applied by chemical vapor deposition ("CVD"), plasma enhanced chemical vapor deposition ("PECVD"), physical vapor deposition ("PVD"), or other known techniques. Next, a channel, not shown, may be formed in the coating on the front of the carrier wafer 904 by selective etching or other known techniques. The channel may, advantageously, have a shape and size to accommodate the device wafer 902, although other shapes and sizes are possible. The channel may then be filled with a non-stick material, not shown, which creates a low-adhesion area in the center of the carrier wafer 904. The low-adhesion area allows for easier removal of the temporarily bonded device wafer 902. Examples of suitable non-stick materials include fluorocarbons, organic compounds, or any other chemical treatments creating a hydrophobic surface. Alternatively, a masking material may be applied to the outer perimeter of the front of the carrier wafer 904 and the center area of the front of the carrier wafer 904 may be chemically modified to reduce the adhesive properties of the carrier wafer 904 creating a low-adhesion area. This low-adhesion area created by chemically modifying the center of the carrier wafer 904 will also allow for easier removal of the temporarily bonded device wafer 902.

Figure 19:
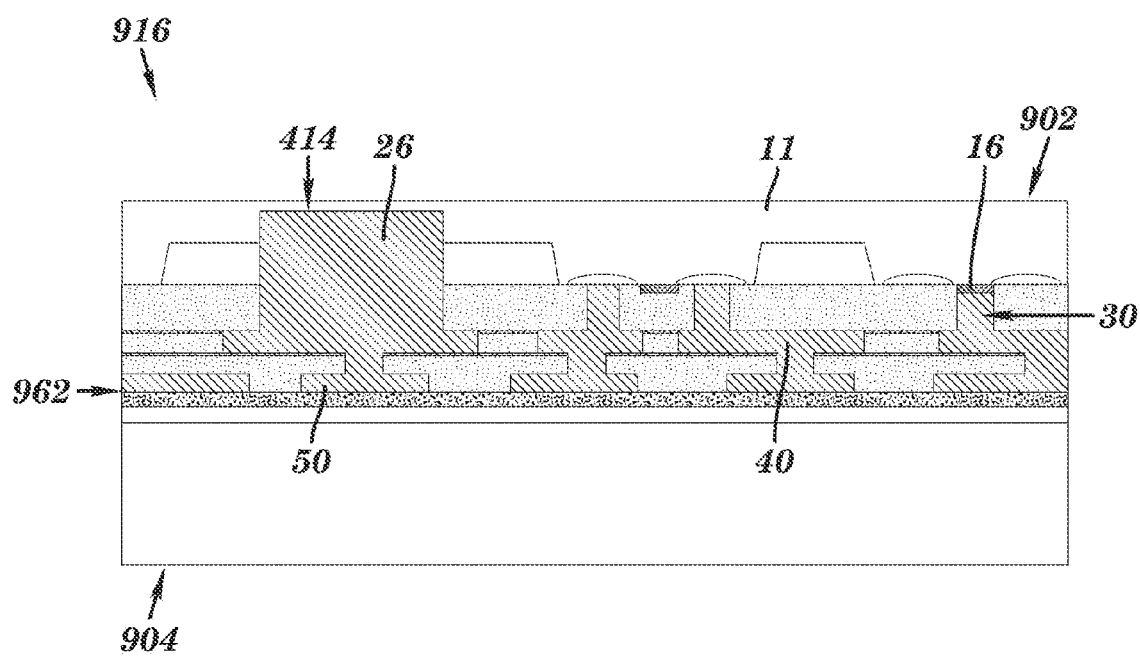
FIG. 19 depicts a cross-sectional view of the wafer and carrier wafer of FIG. 18 bonded together and the wafer having the substrate material removed from the back of the wafer, in accordance with one or more aspects of the present invention.

As depicted in FIGS. 18 and 19, the device wafer 902 is temporarily bonded to the carrier wafer 904 in step 914. More particularly, the temporary adhesive layer, not shown, of the front of the device wafer 902 is aligned with the non-stick material, not shown, on the front of the carrier wafer 904. The temporary adhesive layer may extend slightly past the non-stick material creating a non-stick area where the adhesive layer contacts the non-stick material and a high adhesion area at the outer perimeter of the wafers 902, 904 where the adhesive layer contacts the coating. Then heat and force are applied to temporarily bond the device wafer 902 to the carrier wafer 904. For example, a temporary wafer bond may be formed at a temperature of 250° C., using a force of 16 kN, and applying that force for 5 minutes using a thermoplastic adhesive in a commercial wafer bonding tool. It is also contemplated that the temporary adhesive layer may be applied over the non-stick material on the front of the carrier wafer 904 prior to alignment of the device wafer 902 and carrier wafer 904. The bonded device wafer 902 and carrier wafer 904 create a wafer stack 962. By temporarily bonding the device wafer 902 onto the carrier wafer 904, the device wafer 902 is provided the necessary support in order to allow for thinning and processing of the device wafer 902 without breaking, warping, or folding of the device wafer 902.

Figure 20:
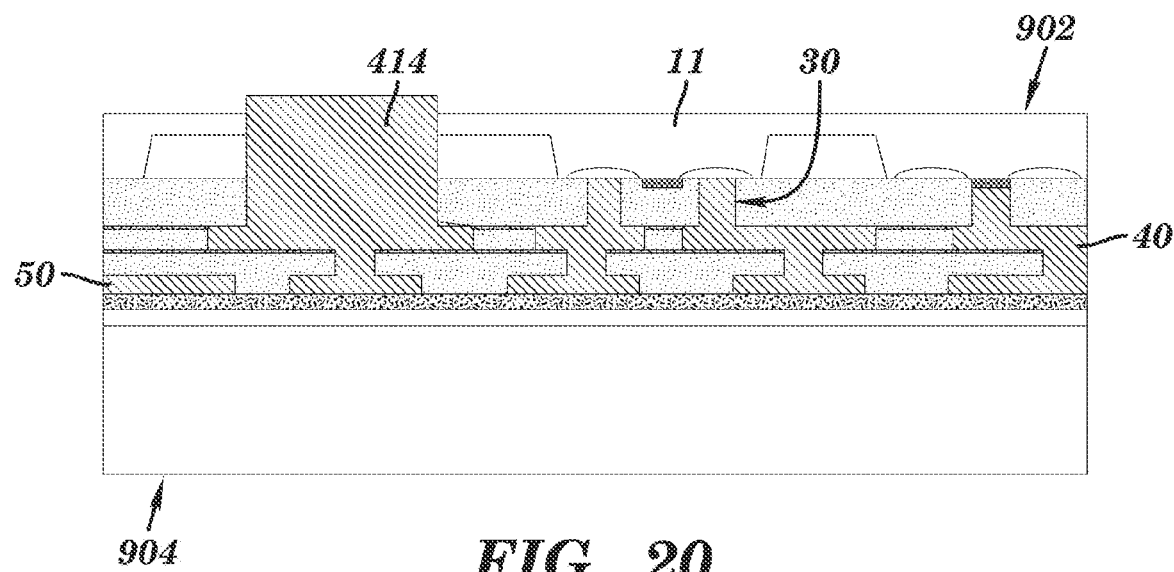
FIG. 20 depicts a cross-sectional view of the wafer after the step of wet etching the back of the wafer to expose at least one feature made of a metallization scheme has been completed, in accordance with one or more aspects of the present invention.
Figure 21:
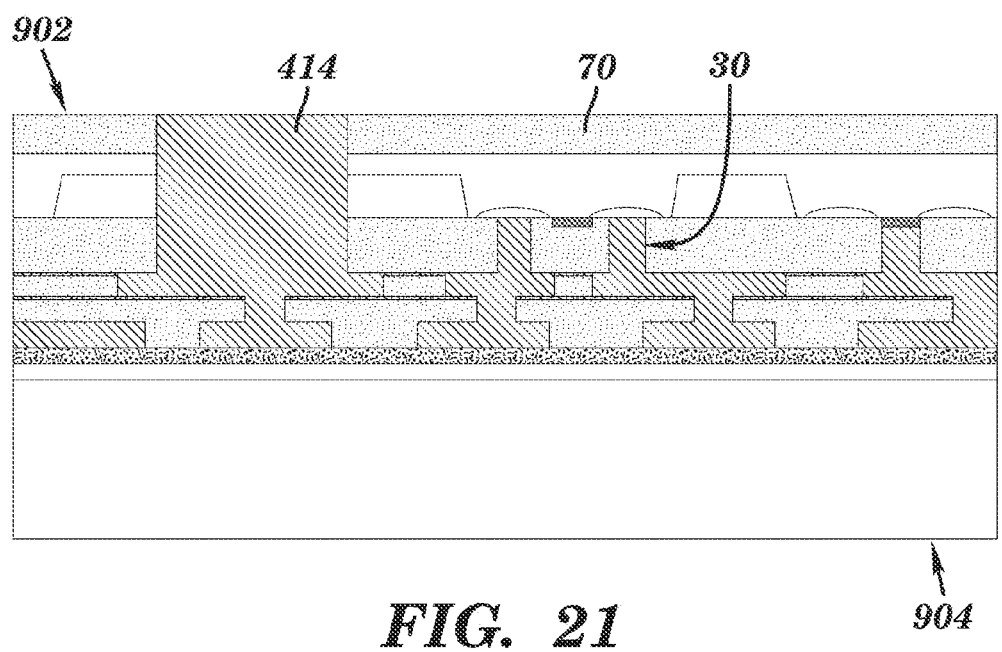
FIG. 21 depicts a cross-sectional view of the step of processing the back of the wafer to create at least one backside redistribution layer wherein an oxide layer has been deposited onto the back of the wafer and the oxide layer has been polished to expose the conductor, in accordance with one or more aspects of the present invention.
Figure 22:
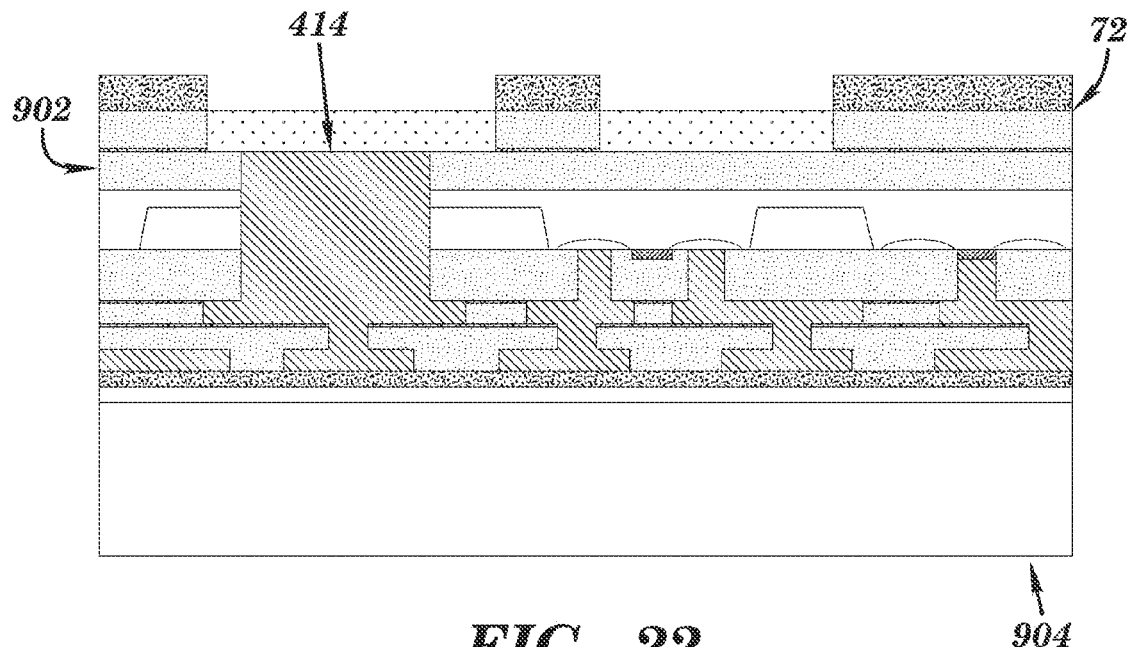
FIG. 22 depicts a cross-sectional view of the step of processing the back of the wafer to create at least one backside redistribution layer wherein the steps of patterning and etching the back of the wafer has been completed, in accordance with one or more aspects of the present invention.
Figure 23:
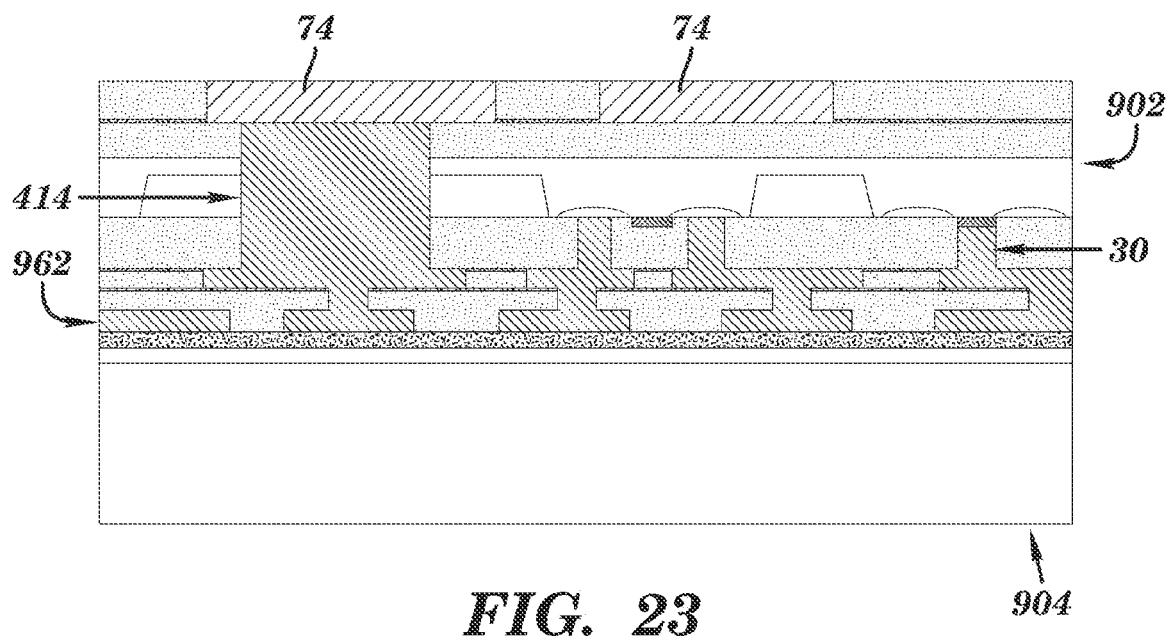
FIG. 23 depicts a cross-sectional view of the step of processing the back of the wafer to create at least one backside redistribution layer wherein the steps of metalizing and polishing the back of the wafer have been completed, in accordance with one or more aspects of the present invention.

Continuing to refer to FIG. 19, the grinding and thinning step 916 is shown. The grinding and thinning step 916 removes the substrate material 11 from the back of the device wafer 902 so that approximately 60 μm of material remains. For example, a grinding wheel may be used to remove the substrate material 11 and thin the device wafer 902, in a known fashion. The bonding process 900 for mounting a die 960 to a base technology wafer 950 may optionally include wet etching 918 the back side of the device wafer 902 to reveal the TSVs 414 or other features made from a metallization scheme, as best seen in FIG. 20. This wet etching may comprise chemicals such as hydrofluoric acid, tetramethylammonium hydroxide, or potassium hydroxide. Referring now to FIGS. 21-23, a backside processing step 920 is performed to create redistribution layers and bump pads, not shown, on the back side of the device wafer 902. Examples of such backside processing include metal and dielectric deposition, patterning using photolithography, chemical mechanical planarization ("CMP"), and etching. As best seen in FIG. 21, the backside processing step 920 may begin with application of an oxide 70 to the back side of the device wafer 902 and the back side of the device wafer 902 may then be polished to expose the TSVs 414. Next, the back side of the wafer 902 may be patterned and etched for the application of back side metallization; as illustrated in FIG. 22, a pattern 72 may be applied to the back side of the wafer 902 and the desired patterned areas etched for application of a metallization layer 74, as illustrated in FIG. 23.

Next, the device wafer 902 is separated from the carrier wafer 904. In order to prepare for separation of the device wafer 902 from the carrier wafer 904, a solvent may optionally be applied in step 924 to the temporary adhesive layer, not shown, to dissolve the temporary adhesive back to the non-stick material on the carrier wafer 904. The solvent may be used to more easily separate the device wafer 902 from the carrier wafer 904. Exemplary solvents include limonene, acetone, N-methylpyrrolidone ("NMP"), mesitylene, methyl ethyl ketone ("MEK"), or trimethyl benzene.

The wafer stack 962 may be flipped in step 926 to place the wafer stack 962 into a preferred orientation for removal of the carrier wafer 904 in this exemplary process. The wafer stack 962 is then mounted from the back side of the device wafer 902 onto a first dicing film frame in step 928. The first dicing film frame may comprise a UV sensitive dicing film and standard dicing frame which serves to provide an adhesive surface to hold the device wafer 902 in place during removal of the carrier wafer 904, but which also allows for easy removal of the device wafer 902 after the carrier wafer 904 has been removed. Next, the separation step 930 is performed to remove the carrier wafer 904 from the device wafer 902. The carrier wafer 904 may be removed from the device wafer 902 using vacuum chucks or other known separating mechanisms.

Once the carrier wafer 904 is removed from the device wafer 902, it is contemplated that the next step may be for the device wafer 902 to be diced into individual die 960. If the device wafer 902 is diced while tacked onto the first dicing film frame, then the first dicing film frame provides an adhesive surface to hold the device wafer 902 in place during dicing, but also allows for easy removal of the individual die 960 after dicing.

Alternatively, the optional steps of cleaning the temporary adhesive off the device wafer 932, applying the wafer stack to a second dicing film frame to flip the wafer stack 934, and removing the first dicing film frame 936, as well as the step of dicing the thin wafer 938 may be performed next. The top surface of the device wafer 902 is cleaned to remove any adhesive that is still present on the device wafer 902 after removal of the carrier wafer 904. The cleaning step may, for example, comprise a solvent clean. The thinned device wafer 902 is then applied to a second dicing film frame, e.g. a standard dicing tape and frames, which serves to provide an adhesive surface to hold the device wafer 902 in place during dicing, but which also allows for easy removal of the individual die 960 after dicing. If the device wafer 902 is flipped over and the front side of device wafer 902 is mounted onto the second dicing film frame. The first dicing film frame may then be removed from the device wafer 902 leaving the device wafer 902 mounted on the second dicing film frame in a preferred orientation for dicing. Next, the thinned device wafer 902 is diced, in conventional fashion, into individual die 960. The good individual die 960 are then individually removed from the second dicing film frame and may be placed into a transport tray, such as a gel pack, for transporting the individual die 960 to be mounted on a base technology wafer 950 as depicted in step 956. The transport tray may include a gel-like material providing a low tack adhesion to hold the individual die 960 in place during shipping.

Figure 24A:
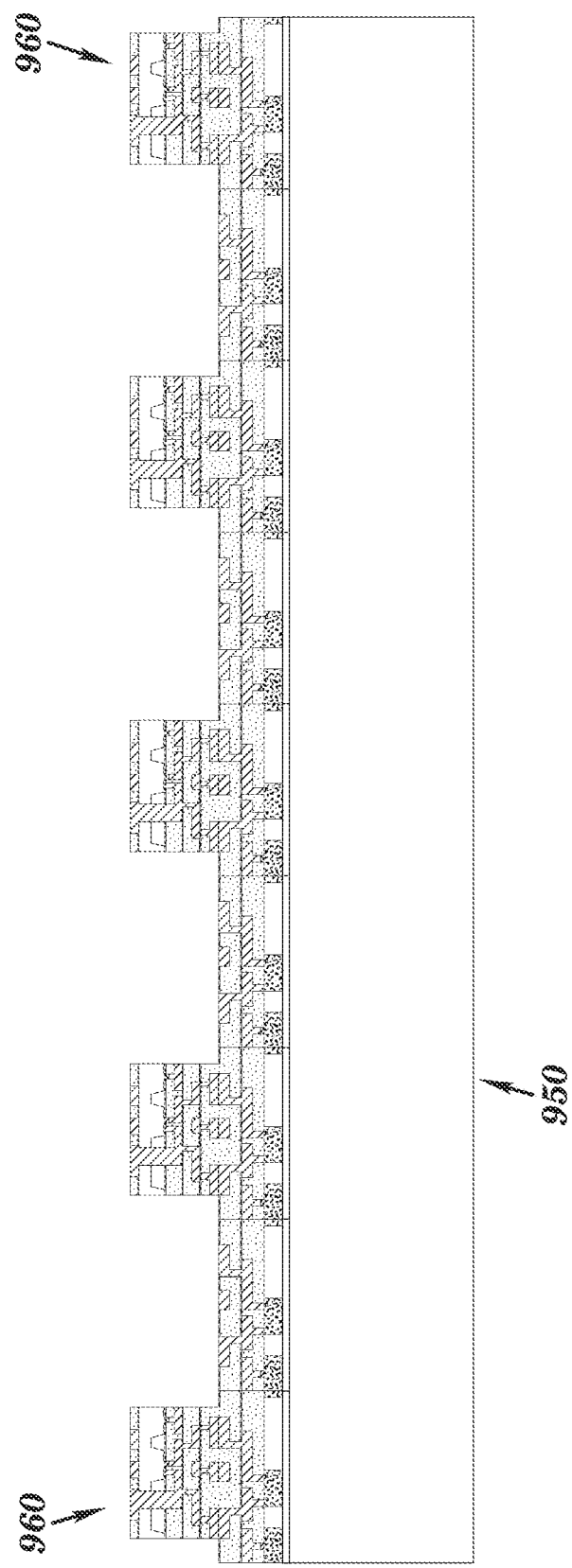
FIG. 24A depicts a cross-sectional view of five thinned CMOS device die bonded to a base technology wafer, in accordance with one or more aspects of the present invention.
Figure 24B:
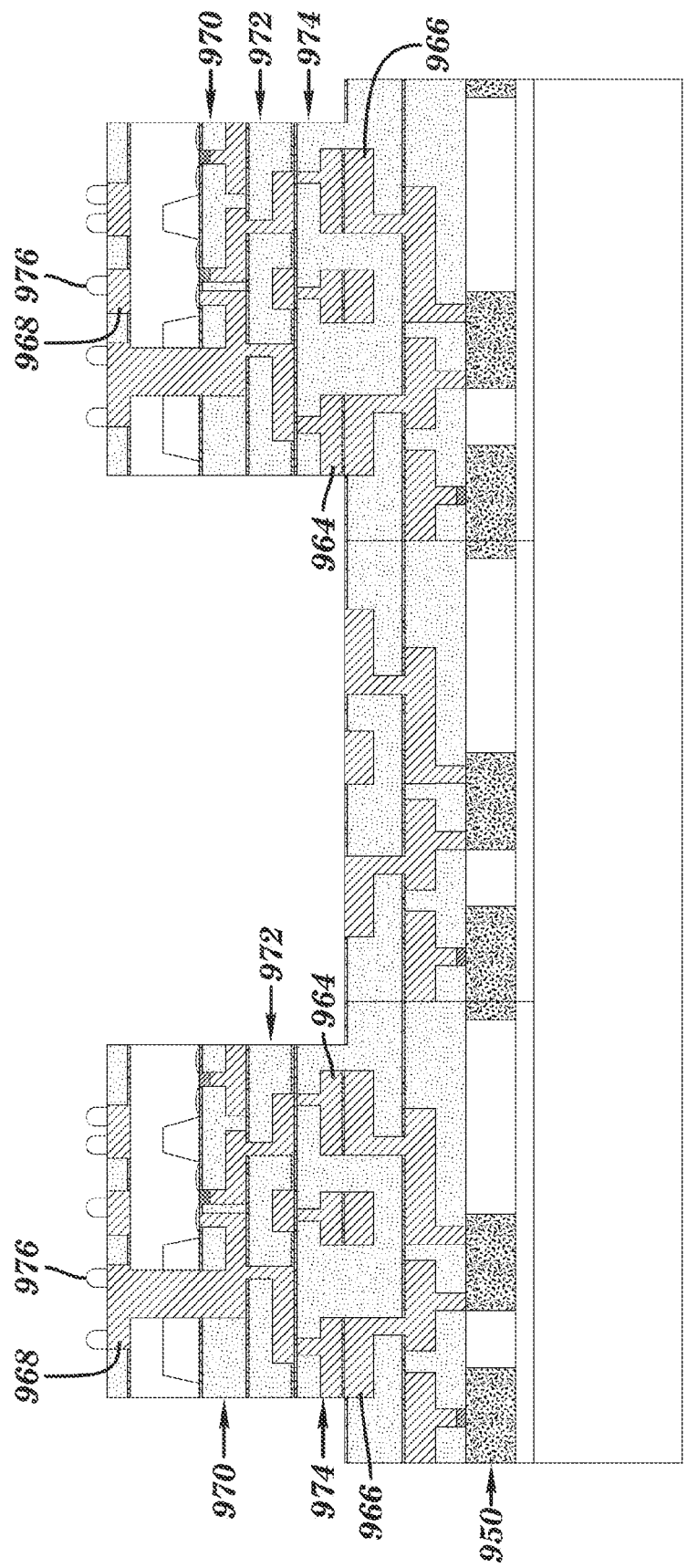
FIG. 24B depicts an enlarged cross-sectional view of two of the thinned CMOS device die bonded to the base technology wafer of FIG. 23A, in accordance with one or more aspects of the present invention.

The step 956 of bonding the individual die 960 to a base technology wafer 950 is depicted in FIGS. 24A-24B. The bonding step 956 may include the step 952 of applying, for example, by spin coating, a sacrificial adhesive to the top of the base technology wafer 950. The sacrificial adhesive may be a thermally decomposable adhesive that breaks down at elevated temperatures, evaporating very cleanly and leaving very little residue behind, e.g. sacrificial adhesives produced by Novermer, Promerus, Sumitomo Bakelite, and other. Then the individual die 960 may be removed from the transport tray for mounting onto the base technology wafer 950. It is also contemplated that the sacrificial adhesive may be applied to the individual die 960 after removal from the transport tray, rather than to the base technology wafer 950, prior to the individual die 960 being placed onto the base technology wafer 950. Once the sacrificial adhesive has been applied, the CMOS 16 of the individual die 960 are then aligned and tacked onto the base technology wafer 950 at contacts 964, as seen in step 956. The sacrificial adhesive provides a low temperature bond to hold the individual die 960 in proper alignment on the base technology wafer 950 during the bonding process. Once each of the individual die 960 to be bonded to the base technology wafer 950 have been aligned and tacked into place, the base technology wafer 950 with the tacked-individual die 960 may be placed into a wafer bonder, not shown, to complete the bonding at an elevated temperature. A global application of heat and force is applied by the wafer bonder to each of the individual die 960. The application of heat and force removes the sacrificial adhesive from the base technology wafer 950 and then creates the metal to metal bond between the CMOS contacts 964 of the individual die 960 and the contacts 966 of the base technology wafer 950, as depicted in FIGS. 24A and 24B. The metal to metal bonds may be copper to copper bonds, or employ other metals. Known bonding techniques such as compression bonding, thermo-compression bonding, ultrasonic bonding, fusion bonding, and soldering can be utilized to bond the individual die to the base technology wafer.

Referring now to FIG. 24B, an enlarged section of the five individual die 960 bonded to the base technology wafer 950 of FIG. 24A is shown. Specifically, FIG. 24B depicts a section of FIG. 24A having two enlarged individual die 960 and an enlarged section of the base technology wafer 950. The individual die 960 include two metal layers 970, 972 and a bonding pad layer 974. The back side of the individual die 960 may be processed to add bonding pads 968 for bonding a second layer of individual die 960. The second layer of individual die 960 may be bonded to the first layer of individual die 960 as described above. Additional layers of individual die 960 may be added to the integrated circuit as desired. The additional layers of individual die 960 are possible because the thin individual die 960 make available wiring points, contact pads, or other metallization schemes, such as TSVs, on the backside of the individual dies 960. FIG. 24B also depicts the optional use of solder balls 976 on the back side of the individual die 960 for bonding additional individual die to the first layer of individual die 960 to create a three dimensional integrated circuit. Alternative bonding processes are also contemplated for the individual die created from the methods depicted in FIGS. 1-3.

Various other die to base technology wafer bonding approaches, may optionally be used to supplement the above described die handling and bonding process. The wafers may also be prepared for bonding using wet etching to remove the dielectrics from around the bond pads, which may be copper, aluminum, gold, nickel, solder, or the like, to allow for more reliable direct bonding of the bond pads. By removing the dielectrics around the bond pads prior to bonding the bond pads it is possible to create a high yielding and reliable bond and interface.

By using the bonding process 900 there are a number of advantages over currently used bonding methods including, but not limited to, the ability to integrate devices from different technologies, e.g., CMOS, optoelectronics, MEMS, and other microelectronic devices, to provide new and/or improved capabilities. In addition, the yield of the resulting devices may be increased by incorporating only known-good die into the devices and thereby avoiding stacking yield loss, which decreases the overall costs. Furthermore, the ability to bond thin dies allows for the stacking of multiple device layers, including those from different technologies, connected vertically utilizing TSVs while maintaining a low-profile package. The bonding process 900 may also be performed using the existing tooling and materials to create a new process for high-volume production and packaging of stacked three dimensional integrated circuit devices. In addition, the bonding process 900 can create a robust interconnect operation over an extended period of time and harsh conditions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has", and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The invention has been described with reference to the preferred embodiments. It will be understood that the architectural and operational embodiments described herein are exemplary of a plurality of possible arrangements to provide the same general features, characteristics, and general system operation. Modifications and alterations will occur to others upon a reading and understanding of the preceding detailed description. It is intended that the invention be construed as including all such modifications and alterations.

Having thus described the preferred embodiments, the invention is now claimed to be:

1. A method of integrating through substrate vias, comprising:
   obtaining a wafer of semiconducting material, wherein the wafer has a front, a back, and at least one side, and the back is comprised of a substrate material;
   performing front end of line processing on the wafer;
   providing one or more through substrate vias in the wafer, comprising:
   etching from a wafer surface into the wafer to create one or more wafer holes
   depositing a dielectric liner onto the wafer surface and into the one or more wafer holes;
   depositing a metal barrier and seed layer onto the wafer surface and into the one or more wafer holes;

plating the one or more wafer holes with a conductor; and polishing the wafer to remove any of the conductor and metal barrier and seed layer from the surface of the wafer;

performing middle of the line processing on the wafer after forming the one or more through substrate vias in the wafer;

performing back end of line processing on the wafer;

providing a carrier wafer having a front, a back, and at least one side;

bonding the front of the wafer to the carrier wafer using an adhesive;

removing, from the back of the wafer, the substrate material;

wet etching, from the back of the wafer, to expose at least one feature made from a metallization scheme;

processing the back of the wafer to create at least one backside redistribution layer;

removing the wafer from the carrier wafer;

dicing the wafer into individual die;

providing a base technology wafer having a front, a back, and at least one side;

coating the front of the base technology wafer with a sacrificial adhesive;

placing the front of the individual die onto the front of the base technology wafer; and bonding the individual die to the base technology wafer.

2. The method of claim 1, wherein performing the front end of line processing on the wafer comprises:

etching one or more trenches into the wafer;

depositing one or more dielectric materials into the one or more trenches;

polishing the wafer to remove any excess dielectric material;

building at least one complementary metal-oxide semiconductor device onto the wafer; and applying a contamination barrier over the wafer, the one or more trenches, and the at least one complementary metal-oxide semiconductor device.

3. The method of claim 2, further comprising:

applying a resist material over the contamination barrier.

4. The method of claim 1, wherein providing the one or more through substrate vias in the wafer comprises:

etching from a wafer surface into the wafer to create one or more wafer holes;

depositing a dielectric liner onto the wafer surface and into the one or more wafer holes;

plating the one or more wafer holes with a conductor; and polishing the wafer to remove any of the conductor from the surface of the wafer.

5. The method of claim 4, further comprising:

polishing the wafer to remove the dielectric liner on the wafer to obtain a thickness to enable contact with at least one complementary metal-oxide semiconductor device;

cleaning the wafer and wafer holes to remove any contaminants from the surface of the wafer and wafer holes; and applying a metal seed layer to the wafer and wafer holes before plating the one or more wafer holes with a conductor.

6. The method of claim 4, further comprising:

annealing the wafer, after the wafer is polished to promote any of the conductor from the one or more through substrate vias to expand out of the one or more wafer holes during operation of a device containing the wafer;

polishing the wafer to remove any of the conductor from the surface of the wafer which was created from annealing the wafer; and applying an etch stop to the surface of the wafer.

7. The method of claim 1, wherein performing the middle of line processing on the wafer comprises:

patterning where to etch one or more device contacts on the wafer;

etching the one or more device contacts to contact one or more complementary metal-oxide semiconductor devices mounted on the wafer;

metalizing the one or more device contacts; and polishing the wafer to remove any metal from the surface of the wafer.

8. The method of claim 1, wherein performing the back end of line processing on the wafer comprises:

applying a first metal layer to contact the one or more through substrate vias and one or more device contacts for one or more complementary metal-oxide semiconductor devices.

9. The method of claim 8, further comprising:

applying a plurality of metal layers to the first metal layer to create a desired metallization scheme and wherein the last layer applied is a bonding pad configuration for bonding the wafer to a second wafer.

10. The method of claim 1, wherein the bonding of the individual die to the base technology wafer is selected from compression bonding, thermo-compression bonding, ultrasonic bonding, fusion bonding, and soldering.

11. A method of integrating through substrate vias, comprising:

obtaining a wafer of semiconducting material, wherein the wafer has a front, a back, and at least one side, and the back is comprised of a substrate material;

etching one or more trenches into the wafer;

depositing one or more dielectric materials into the one or more trenches;

polishing the wafer to remove any excess dielectric material from the one or more trenches;

building at least one semiconductor device onto the wafer;

applying a contamination barrier over the wafer, the one or more trenches, and the at least one semiconductor device;

etching from a wafer surface into the wafer to create one or more wafer holes;

depositing a dielectric liner onto the wafer surface and into the one or more wafer holes;

polishing the wafer to remove the dielectric liner on the wafer to a desired dielectric height suitable for contact with one or more semiconductor devices;

depositing a liner and seed for metalizing the through substrate vias;

plating the one or more wafer holes with a conductor;

polishing the wafer to remove any of the conductor from the surface of the wafer;

annealing the wafer, after the wafer is polished to promote any of the conductor from the through substrate via to expand out of the one or more wafer holes prior to operation of a device containing the wafer;

polishing the wafer to remove any of the conductor from the surface of the wafer which was created from the annealing process;

applying an etch stop to the surface of the wafer;

patterning where to etch one or more device contacts in the dielectric liner after forming the through substrate vias;

etching the one or more device contacts to contact one or more semiconductor devices mounted on the wafer;

metalizing the one or more device contacts;

polishing the wafer to remove any metal from the surface of the wafer;

applying at least one metal layer to contact the through substrate vias and one or more device contacts for one or more semiconductor devices;

applying a fully metalized back end of line ending with a bond pad layer for bonding of the wafer;

providing a carrier wafer a front, a back, and at least one side;

bonding the front of the wafer to the carrier wager using an adhesive;

removing, from the back of the wafer, the substrate material;

wet etching, from the back of the wafer, to expose at least one feature made from a metallization scheme;

processing the back of the wafer to create at least one backside redistribution layer;

removing the wafer from the carrier wafer;

dicing the wafer into individual die;

providing a base technology wafer having a front, a back, and at least one side;

coating the front of the base technology wafer with a sacrificial adhesive;

placing the front of the individual die onto the front of the base technology wafer; and bonding the individual die to the base technology wafer.

12. The method of claim 11, further comprising:

applying a dielectric film over the entire wafer.

13. The method of claim 11, further comprising:

polishing the wafer to remove the dielectric liner on the wafer to obtain a thickness to enable contact with at least one semiconductor device after etching the one or more wafer holes; and cleaning the wafer and wafer holes to remove any contaminants from the surface of the wafer and wafer holes prior to applying the metallization liner and seed.

14. The method of claim 11, further comprising:

applying a plurality of metal layers to the first metal layer to create a desired configuration for wiring and bonding the wafer to a second wafer.

15. The method of claim 11, wherein the at least one semiconductor device comprises at least one complementary metal-oxide semiconductor device.

16. The method of claim 11, wherein the bonding of the individual die to the base technology wafer is selected from compression bonding, thermo-compression bonding, ultrasonic bonding, fusion bonding, and soldering.

17. A device wafer, comprising:

a semiconducting layer;

one or more complementary metal-oxide semiconductor devices on a top surface of the semiconducting layer;

one or more through substrate vias integrated into the semiconducting layer of the device wafer, wherein the through substrate vias comprise:

a dielectric liner layer;

a metal barrier and seed layer positioned inside the dielectric liner layer; and a conductor material within the metal barrier and seed layer;

one or more device contacts formed over the one or more complementary metal-oxide semiconductor devices after formation of the one or more through substrate vias;

at least one metal layer applied over the through substrate vias; and device contacts; and one or more bond pads mounted onto a top layer of the at least one metal layer, wherein the at least one metal layer is arranged to enable placement of the one or more bond pads at a specified location for bonding to a second device wafer.

* * * * *